(12) United States Patent
Goesele et al.

(10) Patent No.: US 8,927,342 B2
(45) Date of Patent: Jan. 6, 2015

(54) LEADFRAME FOR ELECTRONIC COMPONENTS

(75) Inventors: Peter Goesele, Roehlingen (DE); Friedrich Seger, Knittlingen (DE); Josef Sinder, Ellwangen (DE); Joachim Stifter, Muehlacker (DE); Oliver Werner, Muehlacker (DE)

(73) Assignee: Tyco Electronics AMP GmbH, Bensheim (DE)

( * ) Notice: Subject to any disclaimer, the term of this patent is extended or adjusted under 35 U.S.C. 154(b) by 344 days.

(21) Appl. No.: 13/124,115

(22) PCT Filed: Oct. 12, 2009

(86) PCT No.: PCT/EP2009/063247
§ 371 (c)(1),
(2), (4) Date: Jul. 18, 2011

(87) PCT Pub. No.: WO2010/043580
PCT Pub. Date: Apr. 22, 2010

(65) Prior Publication Data
US 2011/0260304 A1  Oct. 27, 2011

(30) Foreign Application Priority Data
Oct. 13, 2008 (DE) .................... 10 2008 051 491

(51) Int. Cl.
*H01L 21/00* (2006.01)
*H01L 23/495* (2006.01)

(52) U.S. Cl.
CPC .... *H01L 23/49517* (2013.01); *H01L 23/49537* (2013.01); *H01L 2924/0002* (2013.01)

USPC ........... 438/123; 438/111; 257/666; 257/669; 257/672; 257/674; 257/E23.031; 257/E23.032

(58) Field of Classification Search
USPC .................. 257/666–677, E23.031–E23.059, 257/E23.005–E23.009, E23.041, 257/E23.053–E23.055; 438/123, 111, 112, 438/FOR. 366, FOR. 367, FOR. 380
See application file for complete search history.

(56) References Cited

U.S. PATENT DOCUMENTS

| | | | |
|---|---|---|---|
| 3,684,464 A | 8/1972 | Happ et al. | |
| 4,176,243 A | 11/1979 | Kovatch et al. | |
| 5,339,518 A | 8/1994 | Tran et al. | |
| 5,811,733 A | 9/1998 | Flaig | |

(Continued)

FOREIGN PATENT DOCUMENTS

| | | |
|---|---|---|
| EP | 0157685 A1 | 10/1985 |
| EP | 0226498 A1 | 6/1987 |

(Continued)

OTHER PUBLICATIONS

International Search Report and Written Opinion issued by the European Patent Office for PCT/EP2009/063247 on Jan. 1, 2010, 13 pages.

(Continued)

*Primary Examiner* — Jasmine Clark
(74) *Attorney, Agent, or Firm* — Faegre Baker Daniels LLP

(57) ABSTRACT

The present invention specifies a leadframe for electronic components and a corresponding manufacturing process, in which the bonding islands are formed by welding individual, prefabricated segments of a bonding-capable material onto a stamped leadframe.

27 Claims, 6 Drawing Sheets

(56) References Cited

U.S. PATENT DOCUMENTS

| | | | |
|---|---|---|---|
| 6,552,911 | B1 | 4/2003 | Haupt et al. |
| 2006/0006505 | A1* | 1/2006 | Chiang et al. ................. 257/666 |
| 2006/0049493 | A1 | 3/2006 | Lee et al. |

FOREIGN PATENT DOCUMENTS

| | | | | |
|---|---|---|---|---|
| JP | 58 171838 A | 10/1983 | | |
| JP | 2152267 | 6/1990 | | |
| JP | 0414257 | * 8/1990 | ............. | H01L 23/31 |
| JP | 03297163 A | 12/1991 | | |
| JP | 5144989 | 6/1993 | | |
| JP | 07 221254 A | 8/1995 | | |

OTHER PUBLICATIONS

Search Report dated Jul. 7, 2009, issued by the German Patent and Trademark Office, Munich, Germany, for Priority Application No. DE 102008 051 491.8, three pages.

International Search Report and Written Opinion issued by the European Patent Office for International Application No. PCT/EP2010/054091 on Jul. 1, 2010; 9 pages.

Search Report for German priority Application No. DE 102009016842.7, dated Dec. 22, 2009; 5 pages.

International Preliminary Report on Patentability issued by The International Bureau of WIPO, Geneva, Switzerland, dated Oct. 11, 2011, for International Application No. PCT/EP2010/054091; 6 pages.

\* cited by examiner

LEADFRAME FOR ELECTRONIC COMPONENTS

CROSS-REFERENCE TO RELATED APPLICATIONS

This application is the U.S. national stage application of International Patent Application No. PCT/EP2009063247, filed 12 Oct. 2009, which claims priority to German Application No. 10-2008-051491.8, which was filed 13 Oct. 2008, the disclosures of each are incorporated herein by reference in their entirety.

The present invention relates to leadframes for electronic components and to an associated manufacturing process.

Used as the starting materials for the manufacture of leadframes for electronic components are sheets of a copper or iron-nickel alloy. These materials are, however, unsuitable for wire bonding, i.e. for the electrical connection of the chips positioned on the leadframe to the individual fingers of the leadframe by means of thin wires. In order to enable the welding of the bonding wire to the fingers of the leadframe by heating or ultrasonic welding, it is necessary to coat the leadframe with aluminium, silver, or gold.

Used therefore as starting materials for leadframes, especially in the field of mechatronics, are strips of sheet metal clad in the longitudinal direction with one or more narrow strips of "bonding-capable" metal, e.g. aluminium. In this clad-inlay process, a depression is provided in the longitudinal direction in a metal strip comprising one of the aforementioned alloys, into which depression a thin strip of the bonding-capable metal is pressed. Temperature and pressure give rise to a metallurgical combination between the two metals. The leadframe is then stamped out of the clad metal strip in a manner such that the fingers of the leadframe run transversely relative to the clad metal strips and thus each exhibit a location ("bonding island") with a surface suitable for wire bonding.

FIG. 1A shows an example of a leadframe 100 of this kind, which is shown in FIG. 1B in perspective view, in which each finger 110 exhibits a region 120 clad with a bonding-capable metal. On these bonding islands, the bonding wire can be welded to the leadframe during the wire bonding process, thus creating a contact with the chip located on the leadframe. Once all necessary contacts have been made, the leadframe is encapsulated together with the chip, and the portions of the leadframe that served only for the temporary mechanical stabilisation of the fingers are broken off.

The disadvantages of the conventional procedure are the high costs of the clad starting material and the loss of valuable inlay metal inherent in stamping. Also disadvantageous are the boundary conditions for the geometry of the leadframe associated with the stripwise arrangement of the bonding-capable metal.

It is therefore an object of the present invention to specify an improved leadframe and an associated improved manufacturing process.

This is achieved by the features of the independent claims. Preferred embodiments are the subject of the dependent claims.

The particular approach of the present invention is to produce a leadframe from an unclad metal strip, and only in the second stage to position individual segments of a material suitable for wire bonding on the fingers of the leadframe and weld them thereto.

According to a first aspect of the present invention, a manufacturing process for a leadframe is specified. The process comprises the following stages: production of a leadframe from a first material, positioning prefabricated segments of a second material at predetermined locations on the leadframe, and welding the positioned segments to the leadframe, wherein the segments of the second material exhibit a surface suitable for wire bonding.

According to a second aspect of the present invention, a leadframe for electronic components is made available. The leadframe comprises a leadframe produced from a first material and a plurality of segments of a second material, which are disposed on the leadframe and welded thereto, wherein the segments of the second material exhibit a surface suitable for wire bonding.

The first material is preferably a metal strip made of copper, a copper alloy or an iron/nickel alloy. The leadframe can be produced cost-effectively in this manner using a stamp-preforming process. In addition, the alloy may be selected such that its thermal expansion coefficient can be matched to that of the chip and/or the potting compound.

The second material is preferably a metal strip made of a metal suitable for wire bonding, preferably of aluminium or an aluminium alloy, which is distinguished by especially favourable bonding properties and material costs. Alternatively, a composite material may be selected as the second material, in which a base substance, preferably copper, a copper alloy or an iron/nickel alloy, is clad with a metal suitable for wire bonding, preferably aluminium, silver or gold. The use of costly raw materials can thereby be further reduced. At the same time, it is ensured that the prefabricated segments are easy to weld to the leadframe.

The leadframe advantageously takes the form of a stamped preform, with the result that cost-effective production can be achieved.

The segments of the second material are advantageously disposed in channels in the leadframe. In this manner, the precise positioning of the segments on the leadframe and the subsequent welding are facilitated.

The segments of the second material are preferably welded to the leadframe using a laser beam. The segments of the second material may here be spot-welded to the leadframe at a plurality of locations and/or may be welded to the leadframe with a weld seam on a longitudinal side of the segment. A visual inspection of the welding location is thereby possible.

The spot welds or welding seams are herein advantageously located in the channel of the leadframe between the longitudinal side of the segments of the second material and the caulked side of the channel. Owing to the fact that the welding location is defined by three planes, a stable injection of energy occurs with laser welding.

Alternatively, the segments of the second material may also be partially melted-on through the leadframe from the rear, and thereby welded to the leadframe. This is advantageous especially by virtue of the less stringent positioning requirements, the greater binding cross-section and the natural smoke screening.

The invention will be described below with reference to the attached drawings, in which.

Figure 1A:
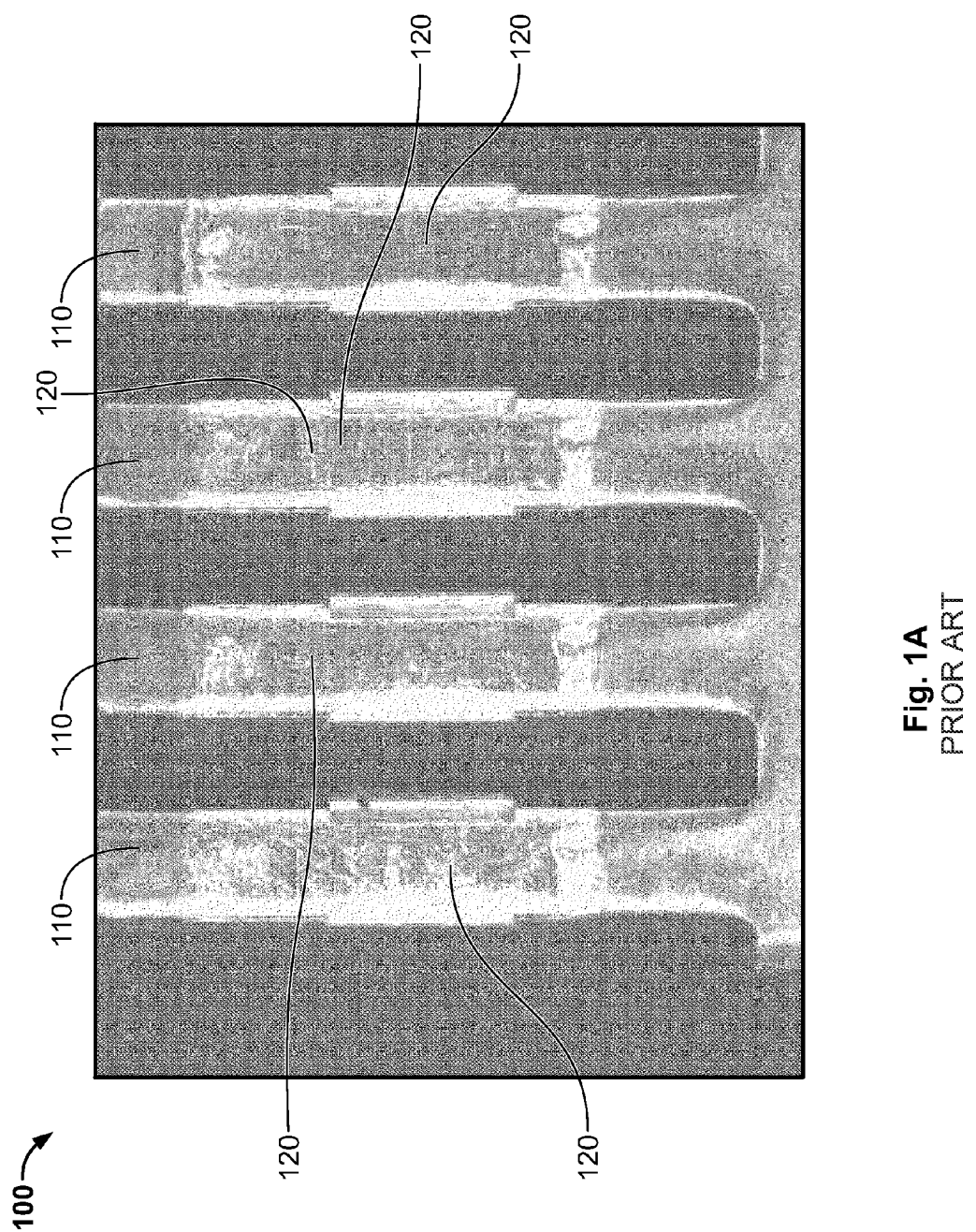
FIG. 1A shows a section of a conventional leadframe.
Figure 1B:
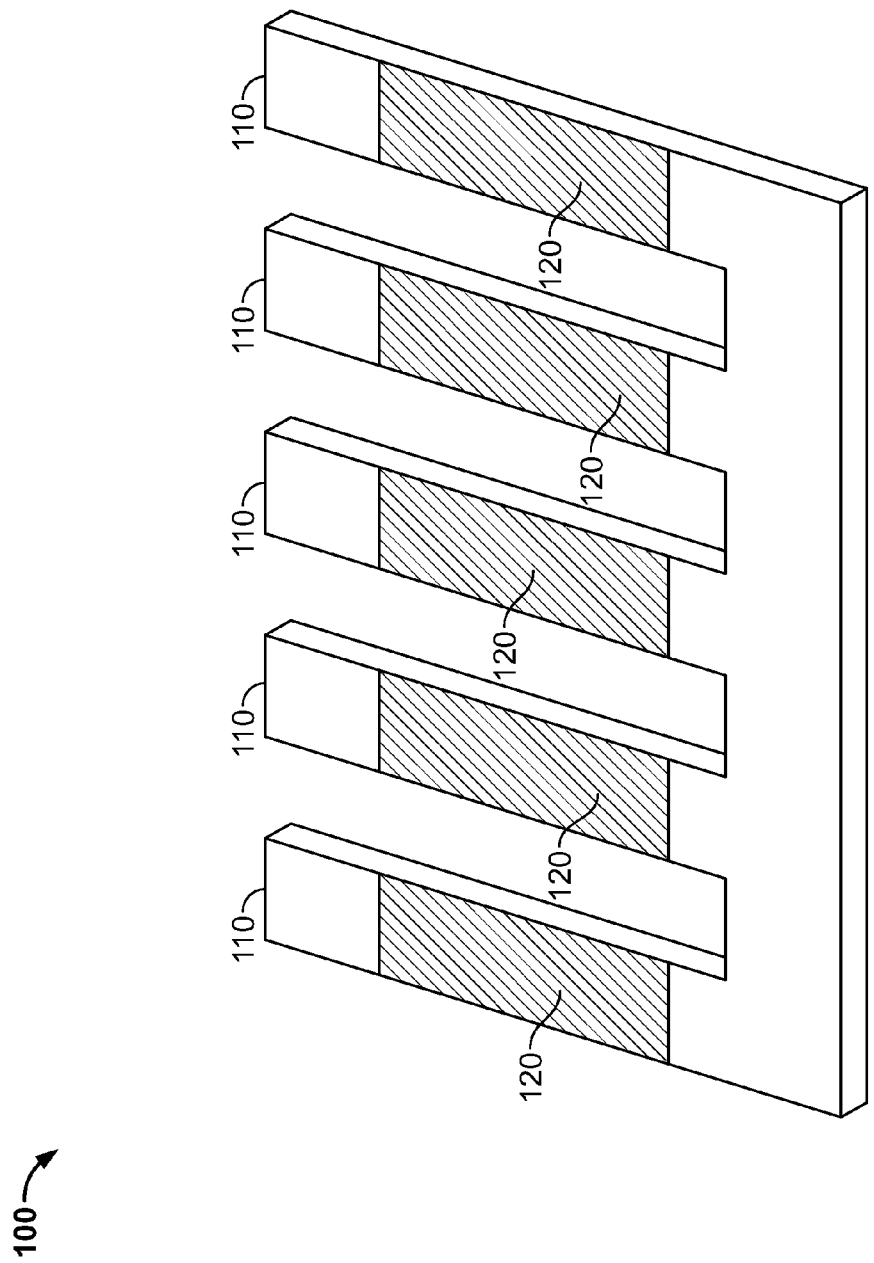
FIG. 1B shows a perspective view of the conventional leadframe from FIG. 1A.
Figure 2A:
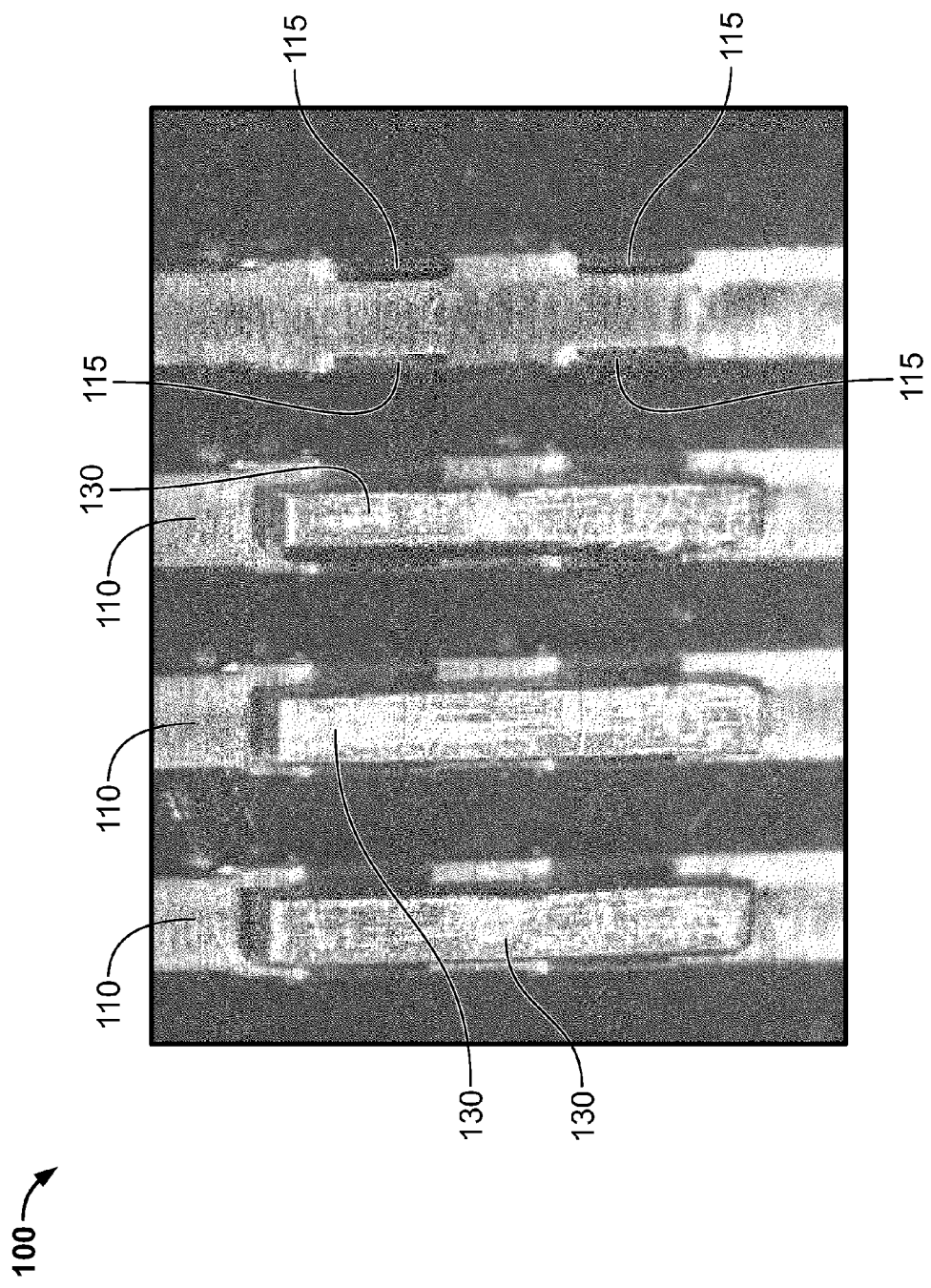
Figure 2B:
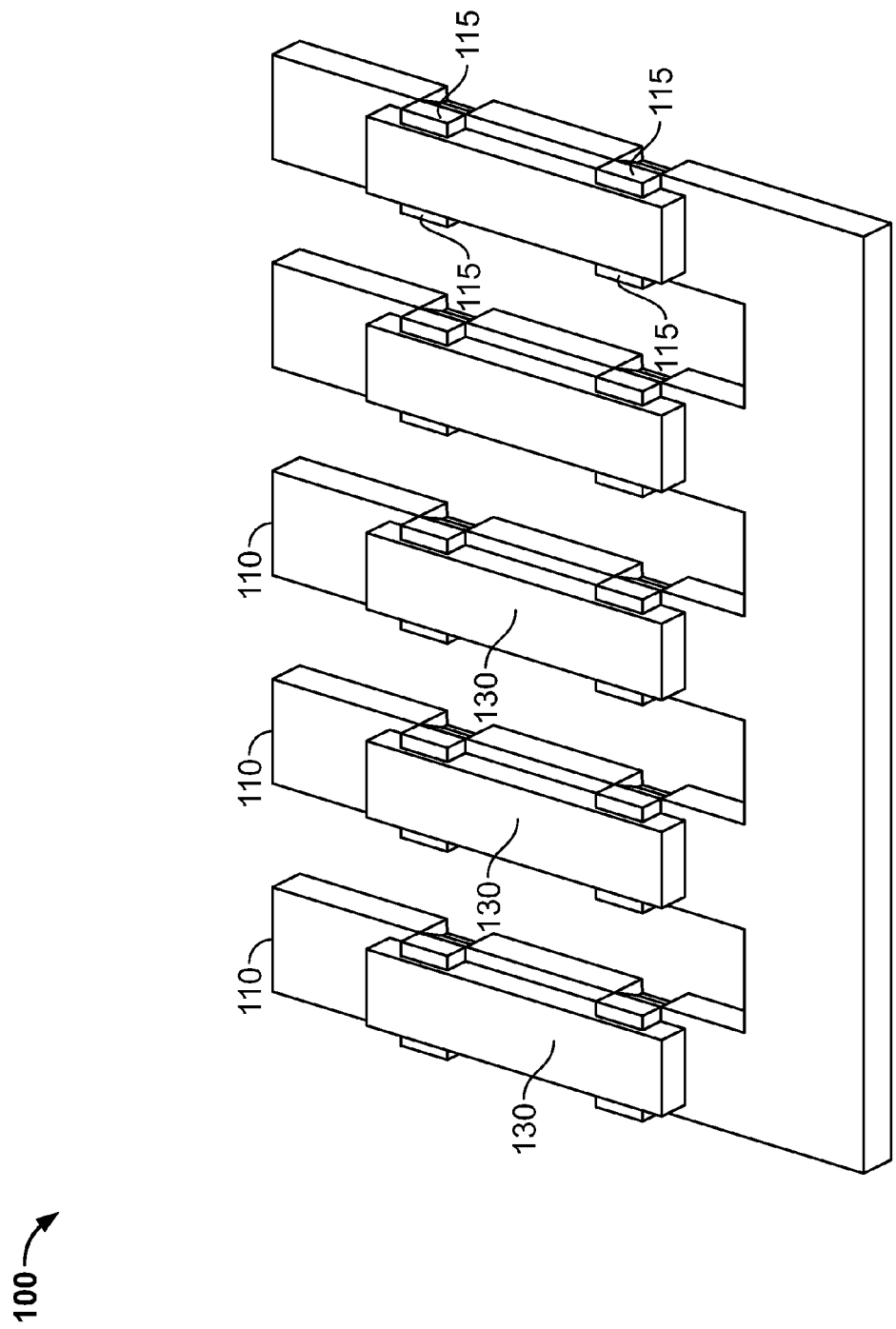
Figure 3A:
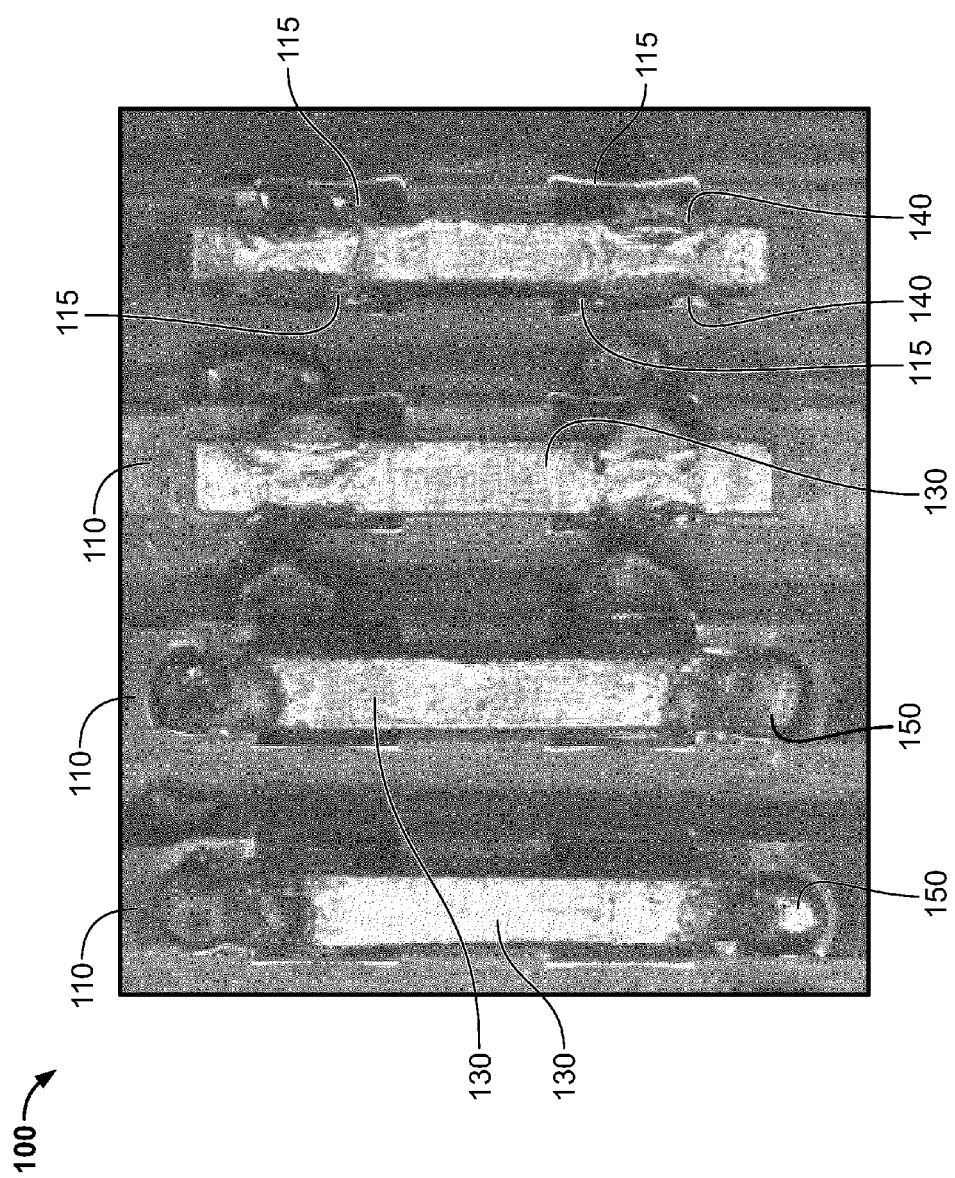
Figure 3B:
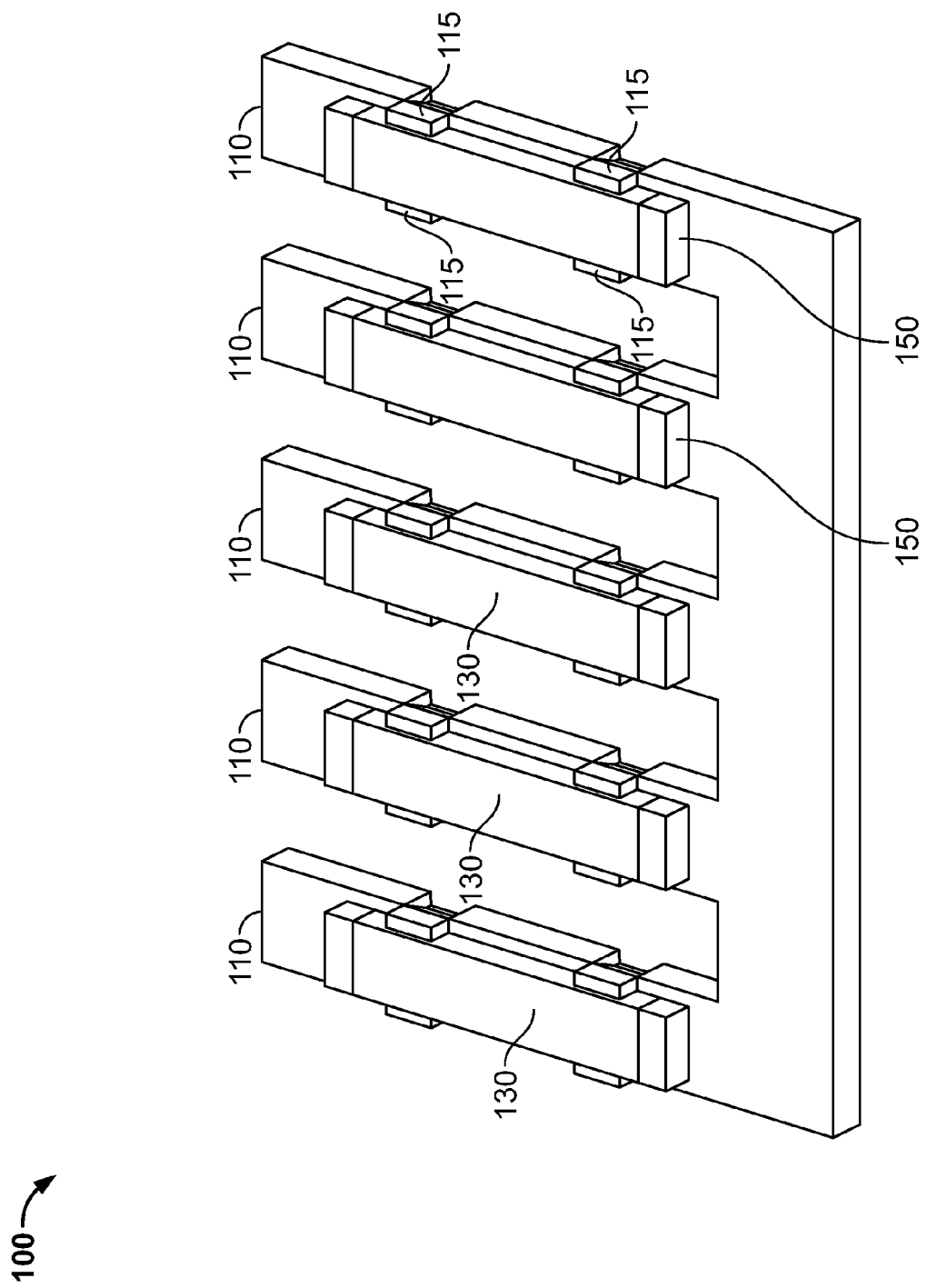

FIG. 2A shows an intermediate stage in a manufacturing process for leadframes according to one embodiment of the present invention, FIG. 2B shows a perspective view of the leadframe according to the embodiment of the present invention shown in FIG. 2A, FIG. 3A shows a section of a leadframe according to one embodiment of the present invention, FIG. 3B shows a perspective view of the leadframe according to the embodiment of the present invention shown in FIG. 3A.

According to the invention, "islands" or "pads" are attached to the leadframe stamped from a single base material as the starting point for wire bonding, this being accomplished by welding individual pieces of a bonding-capable material to the locations on the leadframe provided for the islands. These pieces of bonding-capable material are preferably cuboidal segments of a metal strip in which at least the top surface comprises a metal suitable for wire bonding, e.g. aluminium, silver or gold. This metal strip may comprise solid bonding-capable metal, or may be clad with a (thin) layer of a metal of this kind. The size of these segments is essentially restricted by the width of the fingers of the leadframe. As with conventional leadframes too, the size of the pads realised by these segments is matched to the desired bonding method (heavy-wire bonding, ribbon bonding, multiple bonding, etc.).

FIG. 2A shows a section of a stamped leadframe 100, which is also shown in a perspective view in FIG. 2B and on which cuboidal segments 130 of bonding-capable material have already been positioned on some of the fingers 110. The positioning of the prefabricated segments of bonding-capable material is advantageously facilitated by a retaining projection in the form of lugs 115, which are integrally formed on the leadframe on both sides of the positioning location, and thus constitute a channel.

The function of this retaining projection is to fix the prefabricated segments of bonding-capable material between the insertion station and welding station. Execution of the functions insertion and welding at two separate stations in the automatic machine is thus enabled, so that short cycle times can be achieved.

The present invention is, however, not restricted to the embodiment of the retaining projection shown in FIGS. 2A and 2B, and may, for example, also be configured with more or fewer retaining lugs or with a different arrangement or design thereof.

The leadframe shown in FIGS. 2A and 2B is executed as a stamped preform by way of example. The invention may, however, also be executed in conjunction with different leadframes, e.g. with leadframes produced by a photolithographic etching process.

The segments of bonding-capable material positioned on the leadframe are electrically and mechanically connected to the leadframe in the subsequent stage. By virtue of the dimensions and the required precision, laser welding is an obvious option for this process stage. The present invention is, however, not restricted to a particular welding technique. On the contrary, the advantages of this invention may also be achieved with a different welding technique, e.g. electrowelding.

FIG. 3A shows a section of a leadframe with welded-on bonding islands 130. A perspective view of this leadframe is shown in FIG. 3B. In the example shown, the individual segments of bonding-capable material are fastened with spot welds (140, 150) to the fingers 110 of the stamped leadframe. The spot welds may be located both on the end face of the individual segments (see spot welds 150) and on the longitudinal side (see spot welds 140) of the segments. It is herein advantageous for the spot welds to be placed between the lugs 115 of the leadframe and the lateral face of the segments 130, since in this case an especially good injection of the laser beam can be achieved by virtue of the geometry of the internal surface of the lug 115, the surface of the finger 110 and the lateral face of the segment 130.

The present invention is, however, not restricted to the technique for welding the segments of bonding-capable material and the leadframe that is shown purely by way of example in FIGS. 3A and 3B. Thus, for example, instead of the solder spots, a short weld seam may be drawn using the SHADOW technique (stepless high accurate and discrete one pulse welding). Alternatively, the segment of bonding-capable material may be partially melted-on from the rear of the leadframe, and thus welded to the base material of the leadframe.

Owing to the subsequent welding-on of the bonding islands according to the invention, the consumption of bonding-capable material can be considerably reduced by comparison with the conventional manufacturing process. By relinquishing a clad starting material for the leadframe, the manufacturing costs for leadframes can be reduced. Moreover, the bonding-capable material may be positioned where (and only where) a connection by wire bonding is required. The individual bonding islands may be positioned, independently of one another, at virtually any locations on the leadframe, and no longer all have to lie along a strip. Flexibility in designing the leadframe, the component case and the pin assignment is thus improved.

To sum up, it can be seen that, in the present invention, a leadframe for electronic components and a corresponding manufacturing process have been specified, in which the bonding islands are formed on the stamped leadframe by welding individual, prefabricated segments of a bonding-capable material onto the stamped leadframe.

The invention claimed is:

1. Manufacturing process for a leadframe with the following stages:
    providing a leadframe from a first material, wherein the leadframe is executed as a stamped preform;
    positioning of prefabricated segments of a second material at predetermined locations on the leadframe,
    welding of the positioned segments to the leadframe, wherein the segments of the second material exhibit a surface suitable for wire bonding, and wherein the segments of the second material are partially melted-on through the leadframe from the rear, and thereby welded to the leadframe.

2. Manufacturing process according to claim 1, wherein the first material is a strip of metal comprising copper, a copper alloy or an iron/nickel alloy.

3. Manufacturing process according to claim 1, wherein the second material is a strip of metal comprising a metal suitable for wire bonding, preferably being aluminium or an aluminium alloy.

4. Manufacturing process according to claim 1, wherein the second material is a composite material in which a base substance, preferably copper, a copper alloy or an iron/nickel alloy, is clad with a metal suitable for wire bonding, preferably aluminium, silver or gold.

5. Manufacturing process according to claim 1, wherein the segments of the second material are disposed in channels in the leadframe.

6. Manufacturing process according to claim 1, wherein the segments of the second material are welded to the leadframe using a laser beam.

7. Manufacturing process according to claim 1, wherein the segments of the second material are spot-welded to the leadframe at a plurality of locations.

8. Manufacturing process according to claim 1, wherein the segments of the second material are welded to the leadframe with a weld seam on a longitudinal side of the segment.

9. Manufacturing process according to claim 8, wherein the spot welds or weld seams are positioned in the channel in the leadframe between the longitudinal side of the segments of the second material and the caulked side of the channel.

10. Leadframe for electronic components with:
a leadframe produced from a first material, and
a plurality of segments of a second material, which are disposed on the leadframe and welded thereto, wherein the leadframe is constructed as a stamped preform;
wherein the segments of the second material exhibit a surface suitable for wire bonding, and wherein the second material is a composite material, in which a base substance, preferably copper, a copper alloy or an iron/nickel alloy, is clad with a metal, preferably aluminium, silver or gold.

11. Leadframe according to claim 10, wherein the first material is a metal strip comprising copper, a copper alloy or an iron/nickel alloy.

12. Leadframe according to claim 10, wherein the second material is a metal strip comprising a metal suitable for wire bonding, preferably aluminium or an aluminium alloy.

13. Leadframe according to claim 10, wherein the segments of the second material are disposed in channels in the leadframe.

14. Leadframe according to claim 10, wherein the segments of the second material are welded to the leadframe using a laser beam.

15. Leadframe according to claim 10, wherein the segments of the second material are spot-welded to the leadframe at a plurality of locations and exhibit a surface suitable for wire bonding.

16. Leadframe according to claim 10, wherein the segments of the second material are welded to the leadframe with a weld seam on a longitudinal side of the segment.

17. Leadframe according to claim 15, wherein the spot welds or weld seams are located in a channel in the leadframe between the longitudinal side of the segments of the second material and the caulked side of the channel.

18. Leadframe according to claim 10, wherein the segments of the second material are partially melted-on through the leadframe from the rear and thereby welded to the leadframe.

19. Manufacturing process for a leadframe with the following steps:
providing a leadframe from a first material,
positioning of prefabricated segments of a second material at predetermined locations on the leadframe, where the second material is selected from a group consisting of:
a strip of metal comprising a metal suitable for wire bonding, preferably being aluminium or an aluminium alloy; and
a composite material in which a base substance, preferably copper, a copper alloy or an iron/nickel alloy, is clad with a metal suitable for wire bonding, preferably aluminium, silver or gold; and
welding of the positioned segments to the leadframe, wherein the segments of the second material exhibit a surface suitable for wire bonding.

20. Leadframe for electronic components with:
a leadframe produced from a first material, and
a plurality of segments of a second material, which are disposed on the leadframe and welded thereto, where the second material is constructed from a group consisting of:
a strip of metal comprising a metal suitable for wire bonding, preferably being aluminium or an aluminium alloy; and
a composite material in which a base substance, preferably copper, a copper alloy or an iron/nickel alloy, is clad with a metal suitable for wire bonding, preferably aluminium, silver or gold; and
wherein the segments of the second material exhibit a surface suitable for wire bonding.

21. Leadframe for electronic components with:
a leadframe produced from a first material, and
a plurality of segments of a second material, which are disposed on the leadframe and welded thereto, wherein the leadframe is constructed as a stamped preform;
wherein the segments of the second material exhibit a surface suitable for wire bonding, and wherein the segments of the second material are disposed in channels in the leadframe.

22. Leadframe for electronic components with:
a leadframe produced from a first material, and
a plurality of segments of a second material, which are disposed on the leadframe and welded thereto, wherein the leadframe is constructed as a stamped preform;
wherein the segments of the second material are spot-welded to the leadframe at a plurality of locations and exhibit a surface suitable for wire bonding.

23. Manufacturing process for a leadframe with the following stages:
providing a leadframe from a first material, wherein the leadframe is executed as a stamped preform, and wherein the first material is a strip of metal comprising copper, a copper alloy or an iron/nickel alloy;
positioning of prefabricated segments of a second material at predetermined locations on the leadframe,
welding of the positioned segments to the leadframe, wherein the segments of the second material exhibit a surface suitable for wire bonding.

24. Manufacturing process for a leadframe with the following stages:
providing a leadframe from a first material, wherein the leadframe is executed as a stamped preform;
positioning of prefabricated segments of a second material at predetermined locations on the leadframe, wherein the second material is a strip of metal comprising a metal suitable for wire bonding, preferably being aluminium or an aluminium alloy;
welding of the positioned segments to the leadframe, wherein the segments of the second material exhibit a surface suitable for wire bonding.

25. Manufacturing process for a leadframe with the following stages:
providing a leadframe from a first material, wherein the leadframe is executed as a stamped preform;
positioning of prefabricated segments of a second material at predetermined locations on the leadframe; and
welding of the positioned segments to the leadframe, wherein the segments of the second material exhibit a surface suitable for wire bonding;
wherein the segments of the second material are welded to the leadframe according to one of the welding processes including laser beam welding, electro-welding and stepless high accurate and discrete one pulse welding (SHADOW).

26. Manufacturing process according to claim 25, wherein the segments of the second material are spot-welded to the leadframe at a plurality of locations.

27. Manufacturing process according to claim 25, wherein the segments of the second material are welded to the leadframe with a weld seam on a longitudinal side of the segment.

* * * * *